INVENTOR
MINORU NAGATA

BY Craig e Antonelli

ATTORNEYS

Nov. 4, 1969 MINORU NAGATA 3,477,031

DIFFERENTIAL AMPLIFIER CIRCUIT EMPLOYING MULTIPLE DIFFERENTIAL AMPLIFIER STAGES

Filed Sept. 8, 1967

2 Sheets-Sheet 2

INVENTOR
MINORU NAGATA

BY Craig & Antonelli

ATTORNEYS

United States Patent Office 3,477,031
Patented Nov. 4, 1969

3,477,031

DIFFERENTIAL AMPLIFIER CIRCUIT EMPLOYING MULTIPLE DIFFERENTIAL AMPLIFIER STAGES

Minoru Nagata, Kodaira-shi, Japan, assignor to Hitachi, Ltd., Tokyo, Japan, a corporation of Japan

Filed Sept. 8, 1967, Ser. No. 666,394
Claims priority, application Japan, Sept. 9, 1966, 41/59,176
Int. Cl. H03f 3/68
U.S. Cl. 330—30 9 Claims

ABSTRACT OF THE DISCLOSURE

This invention relates to an electric circuit (a differential amplifier circuit) connecting $n$ differential amplifiers having the same function or the same characteristic in parallel or series form according to the input signal given in the form of voltage or current and introducing the output signals of each circuit to an adder circuit thereby to make the output $n$ times as large as the input and to reduce the relative error for output signal arising from the induced noise, and from the drift of the electric signal due to the change of ambient temperature to $1/\sqrt{n}$.

BACKGROUND OF THE INVENTION

Field of the invention

This invention relates to a differential circuit device connecting a plurality of differential amplifier in parallel or series form, and the object thereof is to provide a new type of differential circuit device in which an improvement is made in the induced noise and the drift voltage and/or current due to the change of ambient temperature.

Description of the prior art

In general, a differential amplifier is constructed with three resistors (two load resistors and one common resistor) and two active elements such as a transistor and an insulated gate field effect transistor (MOS-FET), each having an emitting electrode (emitter or source electrode), a collecting electrode (collector or drain electrode) and a controlling electrode (base or gate electrode). The differential amplifier is commonly known as a amplifier to decrease the drift voltage and/or current referred to the input signal. However, for example, in a typical differential amplifier using MOS (i.e. metal oxide semiconductor) type field effect transistors it is impossible to form these transistors such that they may have entirely the same characteristic. Therefore, it is difficult to remove completely the drift or the noise signal by means of such a differential amplifier.

SUMMARY OF THE INVENTION

According to this invention, a differential circuit device is provided, in which multiple differential amplifiers are employed and in which an effective improvement is made in the above-mentioned induced noise and the drift voltage and/or current due to the change of ambient temperature. That is, such noise and drift are decreased effectively as compared with the output signal.

DESCRIPTION OF THE PREFERRED EMBODIMENTS

Figure 1:
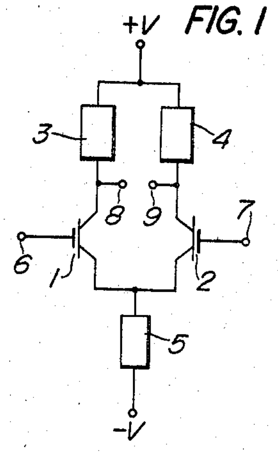
FIG. 1 shows a circuit of conventional differential amplifier.

Explanations will be made firstly of a typical conventional differential amplifier which is commonly known to decrease the drift voltage and/or current referred to the input signal. FIG. 1 shows a conventional differential amplifier circuit using MOS type field effect transistors 1 and 2. These transistors may be replaced by well known bipolar transistors or vacuum tubes. 3 and 4 designate load resistors and 5 designates a common resistor connected in common with each transistor. When two input signals are applied to the input terminals 6 and 7, which are connected to insulated gas electrodes of two MOS-field effect transistor, respectively, the difference between these signals is amplified and then appears across the output terminals 8 and 9. Hence, if two common mode inputs including, the same value of the drift voltage and/or current due to the change of ambient tempertture or the induced noise are applied to the transistors 1 and 2 by a certain influence, there will appear no noise or drift component across the output terminals 8 and 9. This will be apparent from the following reason. Although transistors 1 and 2 yield amplified drift voltage and/or current or the induced noise components at the output terminals 8 and 9, these components cancel each other because the two transistors have the same characteristics, the same voltage or current amplification factor, and the electric circuit is composed of the differential configuration. Practically, however, it is very difficult in the present technique to form transistors such that they may have entirely the same characteristic. It is difficult, therefore, to remove the drift voltage and/or current or the noise signal completely by means of such a differential amplifier. For example, in a conventional single ended direct coupled circuit using MOS field effect transistors, the drift voltage due to the temperature variation is about 3 to 5 mv./° C. When these circuits are composed of the differential configuration, the average drift voltage decreases to $1/10$ to $1/100$ but not to zero because the drift voltage due to the temperature variation differs with the individual transistor and does not completely vanish.

From a statistical points of view, if the standard deviation of the drift voltage and/or current due to the temperature variation of one transistor is $\sigma$, that for the case of the differential configuration becomes $\sqrt{2}\sigma$. The same order of drift voltage and/or current remains.

Figures 2, 3:
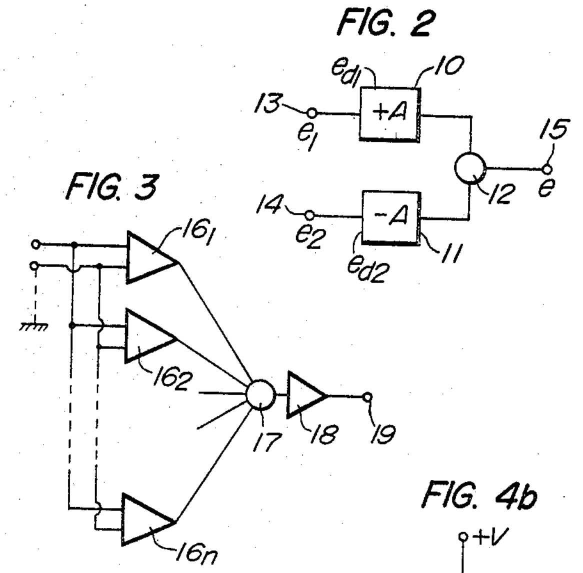
FIGS. 2 and 3 are explanatory views showing the principle of this invention.

According to this invention, a new type differential circuit device employing multiple differential amplifiers is provided in which the utmost improvement is made in the above-mentioned induced noise and the drift voltage and/or current due to the change of ambient temperature. The gist of this invention will be made apparent hereinafter with reference to FIGS. 2 and 3. FIG. 2 shows roughly the principle of the differential amplifier circuit, in which a circuit 10 having a voltage amplification factor of +A and a circuit 11 having that of −A are connected with an adder circuit 12. When input voltages $e_1$ and $e_2$ are applied at the input terminals 13 and 14, a voltage equal to $$e=(e_1A)+(-e_2A) \quad (1)$$

appears at the output terminal 15. We presume that drift voltages $e_{d1}$ and $e_{d2}$ referred to the input enter the circuits 10 and 11 owing to a change of the ambient temperature. Then the output voltage becomes $$\begin{aligned} e&=(e_1+e_{d1})A-(e_2+e_{d2})A \\ &=(e_1-e_2)A+(e_{d1}-e_{d2})A \quad (2) \end{aligned}$$

As evident from Equation 2, the term of the drift voltage becomes theoretically zero because the circuit is composed of the differential configuration and $e_{d1}$ is generally equal to $e_{d2}$. In practical situations, however, it is difficult to form transistors or other circuit components such that they may have entirely the same characteristic. Therefore, the drift term does not always vanish owing to the difference of characteristic between the amplifier circuits 10 and 11.

Now let us consider this problem statistically. When an amplifier is composed of electric circuit components following a statistical variation, the characteristic of this amplifier shows a variation whose mean value and standard deviation are $m$ and $\sigma$ respectively, where $m$ is, for example, the drift voltage arising from the temperature coefficient of the electric circuit component. Next, when the amplifier circuit is composed of the differential configuration (see FIG. 2), a differential amplifier circuit is obtained in which the mean value of the drift voltage is zero by virtue of the differential operation and the standard deviation thereof becomes $\sqrt{2}\sigma$. This is a well-known method. On the other hand, the feature of this invention is that a multiplicity of differential amplifiers thus formed are connected in parallel or series form, thereby obtaining a differential circuit device having an extremely small relative error as compared with output signal. In FIG. 3 a multiplicity of $n$ differential amplifier circuits $\mathbf{16_1}$, $\mathbf{16_2}$ . . . , and $\mathbf{16_n}$ are connected in parallel form and their outputs are added by the adder circuit 17. The output of the adder circuit is amplified by the amplifier 18 and led to the output terminal 19. Let us consider statistically the error value of the multiple differential circuit device shown in FIG. 3. If the standard deviation of the drift voltage due to the temperature variation for the case of a single transistor is $\sigma$, that for the case when two of these transistors are connected to form a differential amplifier circuit becomes $\sqrt{2}\sigma$. When $n$ of these differential amplifier circuits are connected in parallel form, the standard deviation is increased by $\sqrt{n}$ times, i.e. becomes $\sqrt{n}\,(\sqrt{2}\sigma)$. At the same time since the output is increased by $n$ times, so the relative error is reduced to $1/\sqrt{n}$. Therefore, according as the number of differential amplifier circuit is increased, the ratio of the error component to the output signal is remarkably decreased and a highly stable circuit is realized.

In order to understand the principle of this invention more easily explanations will be given hereinafter with reference to the following embodiments.

Embodiment 1

Figure 4A:
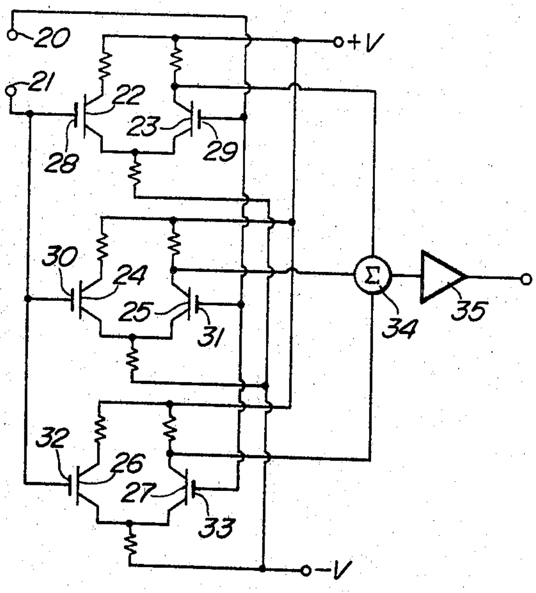
FIGS. 4($a$) and ($b$) are explanatory views of one embodiment of this invention.
Figure 4B:
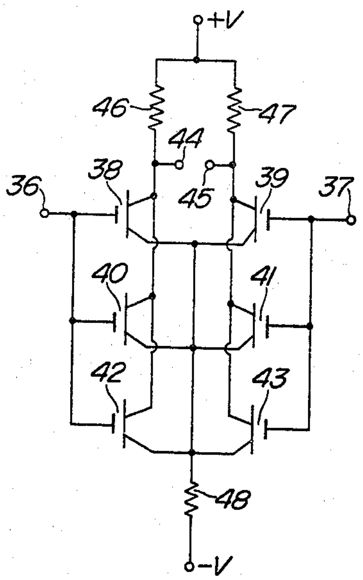

In FIG. 4($a$) three differential amplifiers are connected in parallel form such that outputs of each differential amplifier may be added by the adder circuit 34 and amplified by the amplifier 35. Namely, the input signals applying across the input terminals 20 and 21 are led to the gate electrodes 28, 29, . . . and 33 of MOS type field effect transistors 22, 23, . . . , and 27. Outputs of each differential amplifier are added by the adder circuit 34 and amplified by the amplifier 35. +V and −V show driving sources for each MOS type field effect transistor.

We presume that the drift voltage due to the temperature variation of each transistor is 3000 μv./° C. and that the standard deviation $\sigma=10$ μv./° C. The average temperature coefficient and the standard deviation for the case of a single differential amplifier are zero and $$\sqrt{2}\times 10\ \mu\text{v./}^\circ\ \text{C.}=14.1\ \mu\text{v./}^\circ\ \text{C.}$$

respectively. On the other hand, when three differential amplifier circuits are connected and their outputs are added as shown in FIG. 4($a$), the output signal increases threefold while the drift voltage referred to the input signal is increased by $\sqrt{3}$ times. Hence, the error component of the output is reduced to $14.1/\sqrt{3}=8.15$ μv./° C. Although FIG. 4 shows a case where three differential amplifier circuits are connected in parallel form, much more circuits may be connected so as to reduce the relative error to a desired value. In this case it is needless to say that the average temperature coefficient remains zero.

In FIG. 4($b$), three differential amplifier circuits are also connected in parallel form to obtain the effect of this invention. The input signals are applied to the input terminals (gate electrodes) 38, 39, . . . , and 43 of each MOS type field effect transistors connected in parallel form. Output signals are derived from the output terminals 44 and 45. 46 and 47 designate load resistors connected in common with the individual differential amplifier circuits and 48 designates a common source resistor connected in common with the source electrode of each field effect transistor. +V and −V show driving source for each transistors.

Embodiment 2

Figure 5:
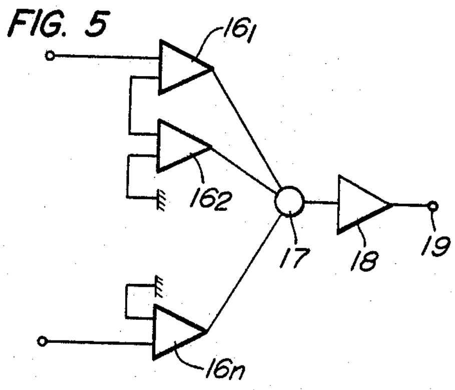
FIG. 5 is an explanatory view of another embodiment of this invention.

FIG. 4 shows an example where the signal is given by a voltage because MOS type field effect transistors used have an extremely high input impedance. It, however, is evident that this invention may be equally applied to a case where the signal is given by a current. In this case, in order to obtain the $n$-fold output, the differential amplifiers should be connected in series form as shown in FIG. 5, in which like reference numerals are used to denote like parts as shown in FIG. 3. Since the current amplification gain of this circuit composition is made $n$-fold, the drift current referred to the input is reduced to $1/\sqrt{n}$.

As has been made apparent in the two typical embodiments, the mean value of error at the output is kept zero by means of the differential amplifier circuit and the output is increased by $n$ times while the relative error referred to the input is reduced to $1/\sqrt{n}$ by connecting $n$-circuits of said differential amplifier circuit in parallel or series form according to whether the signal is given by a voltage or a current. Although this invention may be applied without any restriction to the differential amplifier using vacuum tubes, transistors, and diodes, etc., it is found by the experiments of inventors that many additional effects may be obtained specifically if MOS type field effect transistors are used. Firstly, since the MOS type field effect transistor has an extremely high input impedance, use of the voltage signal is made possible. As a result, the drift current need not be considered. Moreover, when the differential amplifier circuit is composed in the form of an integrated circuit, it is easy to accommodate many circuits in a small area. Although it seems unappropriate in view of practical situations such as cost and size to use many amplifiers in parallel form to decrease the relative error, the present technique makes it possible to form many MOS type field effect transistors in the region adjacent the surface of a semiconductor substrate. It does not require much more effort to form many MOS type field effect transistors in the region as the abovementioned semiconductor substrate (so long as the number is within a certain limit) than to form one MOS type field effect transistor thereon.

Figure 6A:
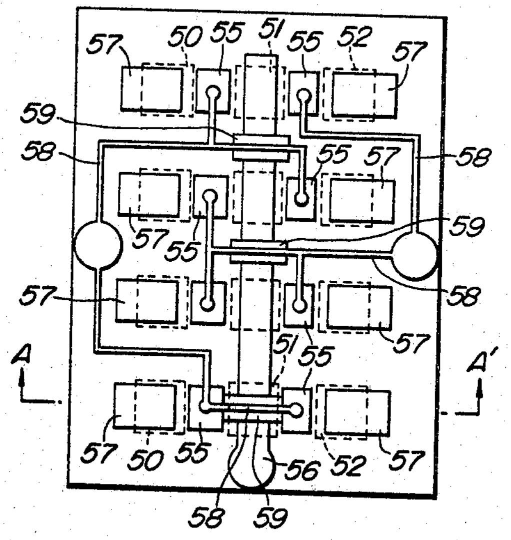
FIGS. 6($a$), ($b$), and ($c$) are explanatory views of an inventive differential circuit device composed in the form of an integrated circuit, in which ($a$) shows a top view, ($b$) a longitudinal cross-section at A–A', and ($c$) an equivalent circuit.
Figure 6C:
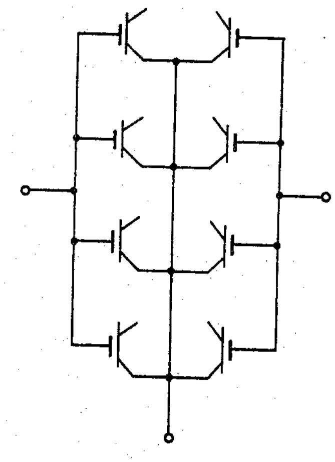
Figure 6B:
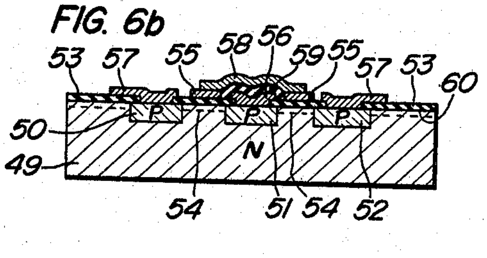

One embodiment of this invention, where MOS type field effect transistors are used in the form of an integrated circuit is shown in FIGS. 6(*a*) (top view), (*b*) (longitudinal cross-section), and (*c*) (an equivalent circuit). Important portions of these figures are shown enlarged for the sake of explanation.

FIG. 6(*c*) shows a differential amplifier circuit composed in the integrated form in the region adjacent the major surface 60 of an N-type silicon substrate. On applying selective diffusion technique of a P-type impurity, P-type diffused regions 50, 51, and 52 are formed in the major surface 60 of the N-type substrate, as shown in FIG. 6(*b*) and indicated by broken lines in FIG. 6(*a*). 53 designates a mask, generally a film of $SiO_2$, which is used for the diffusion of the P-type impurity. On the portions of the silicon substrate underlying the $SIO_2$ film are formed donor regions 54, by the action of said $SIO_2$ film, which regions are generally called as "channel." The electric property of these channels can be controlled by applying a voltage to the electrodes 55 provided on said $SiO_2$ film. These electrodes serve as the gate electrodes of MOS type field effect transistors. Other electrodes, i.e., the source electrodes and the drain electrodes, are formed by a metal layer 56 and metal layers 57 respectively. 58 designates conductive metal layers connecting to said gate electrodes 55 in accordance with the circuit shown in FIG. 6(*c*). Here, the connections are not regularly made. This is because the electric property of the MOS type field effect transistors thus formed in the region adjacent the surface of the semiconductor substrate have few possibilities of following an error distribution. Therefore, the disposition of the gate electrodes is made as shown in FIG. 6(*a*) in such a meaning that MOS type field effect transistors are formed substantially at random in the region adjacent the surface of the semiconductor substrate. At points of intersection between conductive metal layers 58 and the source electrode 56 thin film layers 59 of $SiO_2$, etc., are inserted therebetween in order not to cause a short-circuit.

Thus, the multiple differential circuit shown in FIG. 6(*c*) takes the form of an integrated circuit.

Although FIG. 6 shows a case where four differential amplifier circuits are connected in parallel form, it is possible to form many more circuits in one substrate, thereby reducing the relative error arising from the drift voltage and/or current due to the temperature variation and from the induced noise signal.

A specifically important thing in this invention is that the distribution of characteristics of transistors follows a statistical law. The formation of an integrated circuit is always followed by an irregularity in the characteritic which appears uniformly in the manufacturing process. For example, the temperature coefficient on one side of the semiconductor substrate exceeds that on the other side owing to a variation of the diffusion process, or the diffusion mask shifts from its proper position. In these cases any effect based on the statistical reasoning of this invention will not be obtained. However, if transistors are disposed substantially at random in such a manner as shown in FIG. 6(*a*), the effect according to the invention may be recognized.

Although above descriptions are made with regard to a differenttial amplifier circuit, entirely the same effect may be obtained if the invention is applied to other differential circuits such as a bridge circuit and a modulation and/or demodulation circuit in balanced form.

If this invention is applied at the first stage of a circuit where the input signal level is small, it is most effective and useful in reducing the drift voltage and/or current and the induced noise.

What is claimed is:

1. A differential amplifier circuit comprising:

(a) a plurality of differential amplifiers, each having first and second input terminals and an output terminal from which an output signal and a drift signal are derived, respectively;

(b) first input connecting means commonly connected to all the first input terminals of the plurality of differential amplifiers;

(c) second input connecting means commonly connected to all the second input terminals of the plurality of differential amplifiers;

(d) signal adding means for accumulating signals applied thereto; and (e) introducing means for introducing the output signals from the output terminals of the plurality of differential amplifiers to said signal adding means whereby said signal adding means derives a resultant output signal whose magnitude is $n$ times as large as that of the respective output signals of the plurality of differential amplifiers and a resultant drift signal whose magnitude is $\sqrt{n}$ time as large as that of the respective drift signals of the multiplicity of differential amplifiers, where $n$ is the number of said differential amplifiers.

2. A differential amplifier circuit according to claim 1, wherein each of said differential amplifiers comprises:

(a) two active elements, each having a current emitting electrode, a current collecting electrode and a control electrode;

(b) first and second source supply terminals for impressing an operation voltage across the active elements;

(c) load resistors connected between the respective current collecting electrodes of the active elements and said first source supply terminal;

(d) a common source resistor connected at one end thereof in common to the two current emitting electrodes of the two active elements and at the other end thereof to the second source supply terminal; and wherein the first and second input terminals are connected to the control electrodes of the two active elements, respectively, and the output terminal is connected to at least one of the current collecting electrodes of the two active elements.

3. A differential amplifier circuit according to claim 2, wherein said active elements comprise insulating gate field effect transistors, each having source, drain and gate electrodes.

4. A differential amplifier circuit according to claim 2, wherein said active elements comprise transistors, each having emitter, collector and base electrodes.

5. A differential amplifier circuit comprising:

(a) a plurality of $2n$ active elements, each active element having a current emitting electrode, a current collecting electrode and a control electrode, where $n$ is integer greater than 1, said active elements being divided into first and second groups with each group of active elements being constituted by $n$ active elements;

(b) first input connecting means commonly connected to all the control electrodes of the active elements included in the first group;

(c) second input connecting means commonly connected to all the control electrodes of the active elements included in the second group;

(d) first output connecting means commonly connected to all the collecting electrodes of the active elements included in the first group;

(e) second output connecting means commonly connected to all the collecting electrodes of the active elements included in the second group;

(f) first and second load resistors, each connected at one end thereof to said first output connecting means and to said second output connecting means, respectively, and at the other end thereof in common to the first source supply terminal;

(g) third connecting means commonly connected to all the emitting electrodes of the active elements included in the first and second groups;

(h) a common source resistor connected at one end thereof in common through the third connecting means to all the current emitting electrodes of the active elements and at the other end thereof to the second source supply terminal whereby pairs of corresponding active elements in the first and second groups comprise differential amplifiers; and (i) output terminals connected across said first and second load resistors for deriving a resultant output signal whose intensity is $n$ times as large as that of the output signals of the respective differential amplifiers and a resultant drift signal whose intensity is $\sqrt{n}$ times as large as that of the respective drift signal of the respective differential amplifiers.

6. A differential amplifier circuit according to claim 5, wherein said active elements comprise transistors, each having emitter, collector and base electrodes.

7. A differential amplifier circuit according to claim 5, wherein said active elements comprise insulated gate field effect transistors, each having source, drain and gate electrodes.

8. A differential amplifier circuit according to claim 5, wherein said active elements are transistors constructed integrally on the surface of a semiconductor substrate, each having emitter, collector and base electrodes, and with all the transistors being divided randomly into first and second groups.

9. A differential amplifier circuit according to claim 5, wherein said active elements are insulated gate field effect transistors constructed integrally on the surface of a semiconductor substrate, each having source, drain and gate electrodes and with all the insulated gate field effect transistors being divided randomly into first and second groups.

References Cited

UNITED STATES PATENTS

| | | | |
|---|---|---|---|
| 3,114,057 | 12/1963 | Caruso | 330—30 X |
| 3,213,290 | 10/1965 | Klein et al. | 330—30 X |
| 3,315,171 | 4/1967 | Becker | 328—103 X |

OTHER REFERENCES

"Monolithic Differential Amplifier by Amelco Provides Excellent Tracking," Electronics, p. 115, July 26, 1965.

Thompsen: "A Very High Input Impedance Buffer Using Field Effect Transistors," Electronic Engineering, pp. 370–373, June 1966.

ROY LAKE, Primary Examiner

L. J. DAHL, Assistant Examiner

U.S. Cl. X.R.

328—103; 330—38